US005145760A

United States Patent [19]

Blanchet-Fincher et al.

[11] Patent Number: 5,145,760

[45] Date of Patent: Sep. 8, 1992

[54] POSITIVE-WORKING PHOTOSENSITIVE ELECTROSTATIC MASTER WITH IMPROVED INVIRONMENTAL LATITUDE

[75] Inventors: Graciela B. Blanchet-Fincher; Catherine T. Chang, both of Wilmington, Del.; Richard J. Kempf, Towanda, Pa.

[73] Assignee: E. I. Du Pont de Nemours and Company, Wilmington, Del.

[21] Appl. No.: 603,939

[22] Filed: Oct. 26, 1990

[51] Int. Cl.[5] .......... G03F 5/06

[52] U.S. Cl. .......... 430/73; 430/76; 430/96; 430/56; 430/343; 430/49

[58] Field of Search .......... 430/56, 69, 96, 343, 430/73, 76

[56] References Cited

U.S. PATENT DOCUMENTS

| | | | |
|---|---|---|---|
| 3,445,234 | 5/1969 | Cescon et al. | 430/332 |
| 3,537,848 | 11/1970 | Lane | 430/96 |
| 3,925,074 | 12/1975 | Wyhof | 430/96 |
| 4,495,020 | 7/1990 | Kempf et al. | 430/49 |
| 5,043,237 | 8/1991 | Blachat-Fincher et al. | 430/49 |

*Primary Examiner*—Marion E. McCamish
*Assistant Examiner*—C D. RoDee

[57] ABSTRACT

High resolution, photosensitive electrostatic master which is positive-working with a single imagewise exposure comprising a conductive support bearing a layer of a photosensitive composition consisting essentially of (a) at least two polymeric binders, at least one binder having a Tg greater than 80° C. and at least one binder having a Tg of 70° C. or less such that the shift in transit time ($a_T$) of the photosensitive layer in the range of 30%≦relative humidity≦60% and 65° F. (18.3° C.)≦temperature ≦80° F. (26.7° C.) is 10 or less, (b) a hexaarylbiimidazole photooxidant, (c) leuco dye, preferably stabilized, oxidized by (b), (d) a nonionic halogenated compound, preferably a hydrocarbon, and (e) at least one compatible plasticizer. A process of making positive images by a single imagewise exposure is described. The master is useful in making proofs that duplicate the image achieved by printing, and manufacture of printed circuit boards, etc.

35 Claims, No Drawings

POSITIVE-WORKING PHOTOSENSITIVE ELECTROSTATIC MASTER WITH IMPROVED INVIRONMENTAL LATITUDE

TECHNICAL FIELD

This invention relates to a photosensitive electrostatic master. More particularly, this invention relates to a photosensitive electrostatic master capable of producing positive images from a single imagewise exposure. Still more particularly, this invention relates to a positive-working photosensitive electrostatic master having improved environmental

BACKGROUND OF THE INVENTION

Photopolymerizable compositions and films or elements containing binder, monomer, initiator and chain transfer agent are available commercially. One important application of such photopolymerizable elements is in the graphic arts field. Elements containing such photopolymerizable layers are currently being used as electrostatic masters for analog color proofing and are considered as promising future materials to be developed for digital color proofing applications. For the analog color proofing application, a photopolymerizable layer is coated on an electrically conductive substrate and contact exposed with an ultraviolet (UV) source through a halftone color separation negative. The photopolymerizable composition hardens in the areas exposed with an ultraviolet source due to polymerization and remains in an unexposed liquid-like state elsewhere. The differences in viscosity between the exposed and unexposed areas are apparent in the transport properties, i.e., the unexposed photopolymerizable areas conduct electrostatic charge while the exposed areas are nonconductive. By subjecting the imagewise exposed photopolymerized element to a corona discharge, a latent electrostatic image is obtained consisting of electrostatic charge remaining only in the nonconducting or exposed areas of the element. This latent image can then be developed by application of an electrostatic toner to the surface. When the toner has the opposite charge as the corona charge, the toner selectively adheres to the exposed or polymerized areas of the photopolymerized element.

Photohardenable electrostatic masters are needed that duplicate the imaging characteristics of a printing press. Such electrostatic masters are known wherein the conductivity of both the exposed and unexposed areas can be controlled by introducing into a photopolymerizable composition an electron donor or an electron acceptor molecule that modify the electrical properties of the composition and provides a dot gain similar to that achieved by a printing press.

Although the use of photopolymerizable compositions in electrophotography has been demonstrated and many formulations can be imaged, it did not appear possible, to produce a photopolymerizable electrostatic master that was capable of producing both positive and negative images. Such results have been achieved with photohardenable elements which have a conductive support bearing a photohardenable layer comprising a polymeric binder, a compound having at least one ethylenically unsaturated group, an initiator, a photoinhibitor and at least one sensitizing compound. Positive and negative images are achieved depending on the exposure sequence and exposure wavelength. Such elements are extremely useful because a single element will satisfy the proofing needs of all printers regardless of whether they work with negative or positive color separations. A disadvantage of these elements is that they require two exposures to provide a positive-working electrostatic master.

High resolution, photosensitive electrostatic masters are known which upon a single imagewise exposure form conductive exposed image areas, the master comprising an electrically conductive substrate bearing a layer of a photosensitive composition consisting essentially of (A) organic polymeric binder, (B) a hexaarylbiimidazole photooxidant, (C) a leuco dye that is oxidizable to an ionic species by the photooxidant, (D) a nonionic halogenated compound, and (E) a compatible plasticizer.

However, these masters have been found to have unsatisfactory environmental latitude.

The electrostatic properties of photosensitive masters change considerably with small variations in ambient temperature around room temperature (RT). Relatively small changes in humidity at these temperature conditions also affects electrostatic properties. For example, the discharge rates of the photosensitive layer increase with a rise in temperature. Changes in the discharge rate with ambient temperature result in degradation of print quality as well as unacceptable dot gain and dot range. Lower temperatures (RT−5° C.) show lack of shadow dots while at higher temperatures (RT+5° C.) highlight dots and dot gains diminish.

It has now been found that a photosensitive electrostatic master having improved environmental latitude can be made wherein the above disadvantages are substantially overcome by introducing into the photosensitive composition forming the photosensitive layer a blend of binders, at least one binder having a relatively higher glass transition temperature (Tg) than at least one other binder present. Environmental latitude may be likewise improved by introducing two or more compatible plasticizers into the photosensitive composition. The improved photosensitive electrostatic master exhibits good image quality, electrical properties and temperature stability.

SUMMARY OF THE INVENTION

In accordance with this invention there is provided an improved photosensitive electrostatic master having reduced temperature and humidity sensitivity comprising (1) an electrically conductive substrate, and (2) a layer of photosensitive composition consisting essentially of (a) at least two organic polymeric binders, at least one binder having a Tg greater than 80° C. and at least one binder having a Tg of 70° C. or less than 70° C. such that the shift in transit time (aT) of the photosensitive layer in the range 30% ≦ relative humidity ≦60% and 65° F. (18.3° C.) ≦ temperature<80° F. (26.7° C.) is 10 or less, (b) a hexaarylbiimidazole photooxidant, (c) a leuco dye that is oxidizable to an ionic species by the photooxidant, nonionic halogenated compound, and (d) a nonionic halogenated compound, and (e) at least one compatible plasticizer.

In accordance with an embodiment of this invention there is provided a xeroprinting process for making positive images from a single exposure comprising (A) exposing imagewise to actinic radiation a photosensitive electrostatic master comprising (1) an electrically conductive substrate, and (2) a layer of photosensitive composition consisting essentially of (a) at least two organic polymeric binders, at least one binder having a Tg greater than 80° C. and at least one binder having a Tg of 70° C. or less than 70° C. such that the shift in transit time (aT) of the photosensitive layer in the range 30% ≦ relative humidity≦60% and 65° F. (18.3° C.)≦temperature <80° F. (26.7° C.) is 10 or less, (b) a hexaarylbiimidazole photooxidant, (c) a leuco dye that is oxidizable to an ionic species by the photooxidant, (d) a nonionic halogenated compound, and (e) at least one compatible plasticizer, (B) charging the master electrostatically to form a latent image of electrostatic charge in the unexposed (C) developing the latent image by applying an oppositely charged electrostatic toner or developer, and (D) transferring the toned or developed image to a receptor surface.

DETAILED DESCRIPTION OF THE INVENTION

Throughout the specification the below listed terms have the following meanings:

In the claims appended hereto "consisting essentially of" means the composition of the photosensitive layer of the electrostatic master does not exclude unspecified components which do not prevent the advantages of the photosensitive electrostatic master from being realized. For example, in addition to the primary components, there can be present co-initiators, visible sensitizers, thermal stabilizers or thermal inhibitors, ultraviolet light absorbers, coating aids, electrical property modifiers, e.g., electron acceptors, electron donors, etc.

Glass transition temperature (Tg) is the main characteristic temperature above which the amorphous polymer acquires sufficient thermal energy and changes from a glassy to a rubbery state accompanied by significant changes in physical properties due to facilitated molecular motion.

The invention is based on the discovery that photosensitive layers on conductive supports which consist essentially of components (a) to (e) above are capable of producing masters with improved environmental latitude, positive images with a single exposure, and furthermore a visual print-out image.

Photosensitive layers of this invention having improved environmental latitude have broadened glass transition temperatures with respect to such layers having a single binder. The glass transition range is broadened by introducing into the formulation a blend of binders having high and low Tg's. Blends of compatible plasticizers with different viscosities present in the photosensitive composition likewise improve environmental latitude. The binder mixture consists of at least two polymeric materials with different glass transition temperatures. In general, it has been found that a high Tg binder in the range of about 80°-110° C. and a low Tg binder in the range of about 50°-70° C. are preferred. The molecular weights of the low Tg binders were found not to have a noticeable effect on the environmental latitude of the photosensitive composition.

The primary components include:

BINDERS

Suitable binders (a) include: acrylate and methacrylate polymers and co- or terpolymers or tetrapolymers, vinyl polymers and copolymers, polyvinyl acetals, polyesters, polycarbonates, polyurethanes, polysulfones, polyetherimides and polyphenylene oxides, butadiene copolymers, cellulose esters, cellulose ethers, etc. The selection of a polymeric binder depends on its Tg. The Tg of a polymer is affected by the chemical structures of the main chain and the side groups. Polymers with rigid structures generally show high Tg's while more flexible polymers exhibit low Tg's. Polymers of desired Tg's may be obtained by copolymerization of proper combinations of rigid and flexible monomers. The following publication which summarizes glass transition temperatures of homopolymers known in the literature, "POLYMER HANDBOOK", ed. J. Brandrup & E. H. Immergut, John Wiley & Sons, Inc., New York, N.Y., 1975, is incorporated herein by reference. Section III-140-192 of said publication lists Tg's of most known polymers.

Examples of useful binders having Tg's of 80° C. and greater include:

| TRADE NAME OR CODE | CHEMICAL COMPOSITION | Tg(°C.) |
|---|---|---|
| Vinyl polymers & copolymers | | |
| PSMMA | Poly(styrene(70)/methyl methacrylate(30)) | 95 |
| Cycolac ® CTB (Borg-Warner) | Acrylonitrile/butadiene/styrene | 80-84 |
| | Polystyrene | 100 |
| | Poly(alpha-methylstyrene) | 168 |
| | Poly(vinyl chloride) | 80 |
| | Poly(vinylidene chloride) | 100 |
| | Poly(acrylonitrile) | 96 |
| Methacrylate polymers & copolymers | | |
| | Poly(methyl methacrylate) | 110 |
| | Poly(isobornyl methacrylate) | 147 |
| | Poly(phenyl methacrylate) | 110 |
| | Poly(t-butyl methacrylate) | 107 |
| | Poly(isopropyl methacrylate) | 81 |
| Condensation polymers | | |
| Lexan ® 101 (G.E.) | Polycarbonate | 150 |
| | Polysulfone | 190 |
| ULTEM ® (G.E.) | Polyetherimide | 215 |
| | Poly(phenylene oxide) | 210 |
| | Poly(1,4-Cyclohexanedimethanol terephthalate) | 85 |
| Polyvinyl acetals | | |
| | Poly(vinyl acetal) | 83 |
| Formvar ® (Monsanto) | Poly(vinyl formal) | 92-113 |

Examples of useful binders having Tg's of 70° C. or less include:

| TRADE NAME OR CODE | CHEMICAL COMPOSITION | Tg (°C.) |
|---|---|---|
| Acrylate, methacrylate polymers & copolymers | | |
| | Poly(ethyl methacrylate) | 70 |
| Elvacite ®2042 | Poly(ethyl methacrylate) | 65 |
| Elvacite ®2045 | Poly(isobutyl methacrylate) | 55 |
| Elvacite ®2014 | Methyl methacrylate copolymer | 40 |
| Elvacite ®2044 | Poly(n-butyl methacrylate) | 15 |
| Elvacite ®2046 (E. I. du Pont de Nemours & Co.) | Poly(n-butyl/isobutyl methacrylate) | 35 |
| | Poly(cyclohexyl methacrylate) | 66 |
| | Poly(t-butyl acrylate) | 41 |

-continued

| TRADE NAME OR CODE | CHEMICAL COMPOSITION | Tg (°C.) |
|---|---|---|
| Vinyl polymers and copolymers | | |
| | Poly(vinyl acetate) | 32 |
| | Vinyl chloride/vinyl acetate copolymer | 63 |
| Polyvinyl acetals | | |
| Butvar ® (Monsanto) | Poly(vinyl butyral) | 62-68 |
| Polyurethanes | | |
| Estane ® 5715 (B.F. Goodrich) | Polyurethane | 16 |
| Polyesters | | |
| | Poly(tetramethylene terephthalate) | 45 |
| Butadiene copolymers | | |
| | Styrene/butadiene copolymers | $<70$ |
| Cellulose esters and ethers | | |
| | Ethyl cellulose | 43 |

Preferred binders include the Elvacite ® resins because their Tg's range from 15° C. to 105° C. Low Tg resins including poly(ethyl methacrylate) (Tg 70° C.), Elvacite ®2045 or 2042, in combination with high Tg resins poly(methyl methacrylate) (Tg 110° C.) or poly(-styrene/methyl methacrylate) are particularly preferred. The binder combination of poly(ethyl methacrylate) (Tg 70° C.) and poly(styrene/methyl methacrylate) gave photosensitive compositions with good environmental response and coating properties.

The mixed binders should have a resistivity in the range of 1014 to 1020 ohm-cm, preferably 1014 to 1016 ohm-cm.

PHOTOOXIDANTS

Examples of hexaarylbiimidazole photooxidants (b) are 2,2',4,4',5,5'-hexaarylbiimidazoles, sometimes referred to as 2,4,5-triarylimidazolyl dimers also known as HABI's, which dissociate on exposure to actinic radiation to form the corresponding triarylimidazolyl free radicals. Any 2-o-substituted HABI including those disclosed in the United States patents, set out below, is useful in the photosensitive compositions of this invention. The HABI's can be represented by the general formula:

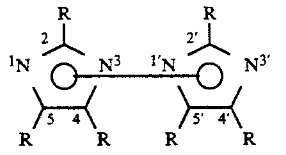

where the R's represent aryl radicals, e.g., phenyl, naphthyl, preferably phenyl radicals, which can be substituted as described in Cescon U.S. Pat. No. 3,784,557, col. 2, line 20 to col. 3, line 67 and col. 23, line 53 to 74, the disclosures of which are incorporated herein by reference. The 2-o-substituted HABI's are those in which the aryl radicals at positions 2 and 2' are ortho-substituted. The other positions on the aryl radicals can be unsubstituted or carry any substituent which does not interfere with the dissociation of the HABI upon exposure or adversely affect the electrical or other characteristics of the photosensitive system. Mixtures of HABI's are also useful. Preferred HABI's are 2-o-chloro-substituted hexaphenylbiimidazoles in which the other positions on the phenyl radicals are unsubstituted or substituted with chloro, methyl or methoxy. The most preferred HABI's are 2,2',4,4'-tetrakis(o-chlorophenyl)-5,5'-bis(m,p-dimethoxyphenyl)biimidazole and 2,2'-bis(o-chlorophenyl)-4,4',5,5'-tetraphenylbiimidazole. Suitable hexaarylbiimidazole photooxidant compounds (b) are disclosed in Chambers U.S. Pat. No. 3,479,185, Chang U.S. Pat. No. 3,549,367, Baum et al. U.S. Pat. No. 3,652,275, Cescon U.S. Pat. No. 3,784,557, Dueber U.S. Pat. No. 4,162,162, Dessauer U.S. Pat. No. 4,252,887, Chambers et al. U.S. Pat. No. 4,264,708, Tanaka et al. U.S. Pat. No. 4,459,349, and Sheets U.S. Pat. No. 4,622,286, the disclosures of each of which are incorporated herein by reference.

LEUCO DYES

Leuco dyes (c) useful in this invention are disclosed in Cescon, U.S. Pat. No. 3,598,592, the disclosure of which is incorporated herein by reference. The leuco dyes described in said patent, column 9, lines 4 to 18, preferably are stable in the leuco dye form when present in the photosensitive composition. Leuco dyes that are less stable than those described above can be used if a thermal stabilizer or inhibitor is present in the composition.

The leuco form of the dye is the reduced form of the dye having one hydrogen atom, the removal of which together with an additional electron in certain cases produces the dye, i.e., a differently colored compound. Such dyes have been described, for example, in U.S. Pat. No. 3,445,234, column 2, lines 49 to 63 and column 3, line 39 to column 7, line 55, the disclosures of which are incorporated herein by reference. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes.

Aminotriarylmethanes are preferred. A general preferred aminotriarylmethane class is that of aminotriarylmethanes wherein at least two of the aryl groups are phenyl groups having (A) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, or benzyl and (B) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (1) Phenyl which can be substituted with lower alkyl, lower alkoxy, chloro, dialkylamino, diarylamino, cyano, nitro, hydroxy, fluoro or bromo;
(2) Naphthyl which can be substituted with amino, di-lower alkylamino, alkylamino;
(3) Pyridyl which can be substituted with alkyl;
(4) Quinolyl;
(5) Indolinylidene which can be substituted with alkyl.

Preferably, $R_1$ and $R_2$ are hydrogen or alkyl of 1 to 4 carbon atoms. Particularly preferred leuco dyes from class (a) above are compounds disclosed in Cescon U.S. Pat. No. 3,598,592, column 9, lines 4 to 18, Class I compounds, because they are stabilized. Preferred stabilized leuco dye compounds from classes (a) and (b) above are tris-(4-diethylamino-o-tolyl)methane, and 9-diethylamino-12-(2-methoxycarbonyl-phenyl)-benz(a)-xanthene.

HALOGENATED COMPOUNDS

Useful halogenated compounds (d) include: halogenated hydrocarbons, which can be aromatic, aliphatic, alicyclic, heterocyclic, and combinations thereof. Preferably halogenated compounds are nonionic. In addition to halogen, these compounds can be substituted by oxygen, amine, amide, hydroxyl, nitrile or phosphate. The hydrocarbyl rings or chains can be interrupted by ether (—O—), ester

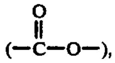 carbonyl 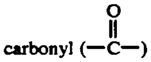 or amide 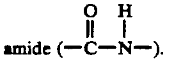.

Halogenated aliphatic compounds include: halogenated alkanes and alkenes of 1 to about 8 carbon atoms, illustrated by such alkanes as carbon tetrachloride; carbon tetrabromide; bromoform; iodoform; iodoethane; 1,2-diiodoethane; 2-bromo-1-iodoethane; 1,2-dibromoethane; 1-bromo-1-chloroethane; 1,1,2,2-tetrabromoethane; hexachloroethane; 1,1,1-trichloroethane; 1,1-bis-(p-chlorophenyl)-2,2,2-trichloroethane; substituted 1,2-dibromoethane compounds as disclosed in Holman U.S. Pat. No. 4,634,657 col. 1, line 56 to col. 2, line 7 and col. 2, line 51 to col. 3, line 2, the disclosures of which are incorporated herein by reference, include: 1,2-dibromo-1,1,2-trichloroethane; 1,2-dibromotetrachloroethane, 1,2-dibromo-1,1-dichloro-ethane, 1,2-dibromo-1,1-dichloro-2,2-difluoroethane, etc.; 1-bromo-3-chloropropane; 1,2-dibromo-3-chloropropane; 1,2,3-tribromopropane; 1-bromobutane; 2-bromobutane; 1,4-dibromobutane; 1-bromo-4-chlorobutane; 1,4-diiodobutane; 1,2,3,4-tetrabromobutane; pentamethylene bromide;-hexamethylene bromide, etc.; halogenated alkanols of 2 to about 8 carbon atoms such as 2-bromoethanol; 2,2,2-trichloroethanol; tribromoethanol; 2,3-dibromo-propanol; 1,3-dichloro-2-propanol; 1,3-diiodo-2-propanol; 1,1,1-trichloro-2-propanol; di(iodohexamethylene) aminoisopropanol; 1,1,1-trichloro-2-methyl-2-propanol; tribromo-t-butyl alcohol; 2,2,3-trichlorobutane-1,4-diol; halogenated cycloaliphatic compounds such as tetrachlorocyclopropene; dibromocyclopentane; hexachlorocyclopentadiene; dibromocyclohexane; chlorendic anhydride; halogenated aliphatic carbonyl containing compounds of 2 to about 8 carbon atoms, which are illustrated by 1,1-dichloroacetone; 1,3-dichloroacetone; hexachloroacetone; hexabromoacetone; pentachloroacetone; 1,1,3,3-tetrachloroacetone; 1,1,1-trichloroacetone; 3,4-dibromobutanone-2; 1,4-dichlorobutanone-2; 1,2,5-trichloropentanone-2; dibromocyclohexanone; halogenated ethers of 3 to about 8 carbon atoms are illustrated by 2-bromoethyl methyl ether; 2-bromoethyl ethyl ether; di(2-bromoethyl)ether; di-(2-chloroethyl)ether; 1,2-dichloroethyl ethyl ether, etc.

Amide and ester halogenated compounds are conveniently discussed in connection with halogenated mono- or dicarboxylic acids of 2 to 8 carbon atoms, as the esters and amides thereof. These compounds have the general formula:

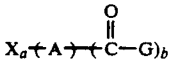

where

X is Cl, Br or I a is an integer from 1 to 4

A is alkyl or alkenyl of 1 to 7 carbon atoms

G is

—OA' or 

where A' is alkyl or haloalkyl of 1 to 15 carbon atoms where halo is Cl, Br or I; A" is hydrogen, alkyl or haloalkyl of 1 to 4 carbon atoms where halo is Cl, Br or I;

b is 1 or 2.

In providing that a is an integer from 1 to 4, it is noted that the obviously chemically impossible structures such as tetrachloroacetamide and β,β,β,-trichlorobutyramide are excluded. Thus, the provision that a is an integer from 1 to 4 is intended to be a shorthand way of indicating that a is an integer from 1 to 3 when A has one carbon atom and that a is an integer from 1 to 4 when A has 2 to 7 carbon atoms, provided that no carbon atom bound to two other carbon atoms contains more than two halogen atoms and no carbon atom bound to one carbon atom contains more than 3 halogen atoms. A can be methyl, ethyl, propyl, butyl, amyl, hexyl, heptyl, including the isomers thereof; vinyl, allyl, isopropenyl, butenyl, isobutenyl, or pentenyl.

The ester can be an ester of a halogenated carboxylic acid, a halogenated ester of a carboxylic acid, or a halogenated ester of a halogenated carboxylic acid as exemplified by chloroacetic; bromoacetic; iodoacetic; dichloroacetic; trichloroacetic; tribromoacetic; 2-chloropropionic; 3-bromopropionic; 2-bromoisopropionic; 2,3-dibromopropionic; 3-iodopropionic; α-bromobutyric; α-bromoisobutyric; 3,4-dibromobutyric; etc.; bromosuccinic; bromomaleic and dibromomaleic, etc., bromoethyl acetate; ethyl trichloroacetate; trichloroethyl trichloroacetate; isoctyl trichloroacetate; isotridecyl trichloroacetate; homopolymers and copolymers of 2,3-dibromopropyl acrylate; trichloroethyl dibromopropionate; iodoethyl dibromobutyrate; ethyl α,β-dichloroacrylate; ethyl 3,4-dibromovinylacetate, etc.

The amides and imides are exemplified by chloroacetamide; bromoacetamide; iodoacetamide; dichloroacetamide; trichloroacetamide; tribromoacetamide; trichloroethyl trichloroacetamide; 3-bromopropionamide; 2-bromoisopropionamide; 2,3-dibromopropionamide; 2,2,2-trichloropropionamide; 2-bromobutyramide; 2-bromoisobutyramide and N-chlorosuccinimide, N-bromosuccinimide, 2,3-dibromosuccinimide, N-[1,1-bis-(p-chlorophenyl)-2,2,2-trichloroethyl]acetamide, etc. Preferred amides are those melting in the range 90° to 150° C. such as the following compounds:

| COMPOUND | MELTING POINT (°C.) |
|---|---|
| $BrCH_2CONH_2$ | 91 |
| $ClCH_2CONH_2$ | 121 |
| $Cl_2CHCONH_2$ | 99.4 |
| $ICH_2CONH_2$ | 95 |

-continued

| COMPOUND | MELTING POINT (°C.) |
| --- | --- |
| $Br_3CCONH_2$ | 121.5 |
| $Cl_3CCONH_2$ | 142 |
| $BrCH_2CH_2CONH_2$ | 111 |
| $(CH_3)_2CBrCONH_2$ | 148 |
| $CH_3CH_2CHBrCONH_2$ | 112.5 |
| $(CH_3)_2CHCHBrCONH_2$ | 133 |

Other halogenated aliphatic hydrocarbon compounds include chlorinated rubbers such as the Parlons® (Hercules, Inc., Wilmington, Del.); poly (vinyl chloride); copolymers of vinyl chloride and vinyl isobutyl ether such as Vinoflex® MP-400 (BASF Colors & Chemicals, Inc., Parsippany, N.J.); chlorinated aliphatic waxes such as Chlorowax® 70 (Occidental Electrochemicals Corp., Los Angeles, Calif.); perchlorocyclodecane; chlorinated paraffins such as Clorafin® 40 (Hercules, Inc., Wilmington, Del.) and Unichlor® 70B (Dover Chemical Corp., Dover, Ohio); and 2,3-bis-(bromoethyl)-1,4-dibromo-2-butene.

Halogenated aromatic hydrocarbon compounds include: polyhalo benzenes such as the di-, tri-, tetra-, penta-and hexachlorobenzenes and bromobenzenes; di-, tri-, and tetra- chloroxylenes and bromoxylenes; di- and trichloroaniline and bromoaniline; polyhalogenated polyphenyl compounds such as the Araclor® plasticizers (Monsanto Co., St. Louis, Mo.) which in general are polychlorinated diphenyls, polychlorinated triphenyls and mixtures thereof; hexabromobiphenyl, tetrabromobisphenol A, etc.

Halogenated heterocyclic compounds include: 2,3,4,5-tetraiodopyrrole, 2-tribromoquinoline, 2-trichlorooxazole, etc.

While it is apparent that both aliphatic and aromatic halides can be successfully employed, it is preferred to use the aliphatic halides; of the aliphatic halides, it is generally preferred to use those halides having more than one halogen atom bound to the same carbon atom, and it is particularly preferred to use those halogenated aliphatic compounds where there are three halogen atoms bound to a single carbon atom. The halogen containing material can be present as a single compound or as a mixture of halogen containing compounds.

Where the compositions are to be prepared and stored for periods of time, stability becomes a factor. For that reason, the volatile materials such as carbon tetrabromide, iodoform, ethyl iodide and 2,2,2-trichloroethanol, which normally work quite well are not preferred in electrostatic masters that will be stored for appreciable periods. These compounds are generally not used because of their odor and/or high volatility. Thus, the halogenated compounds that are nonvolatile liquids or solids are preferred.

PLASTICIZERS

A wide range of nonpolymerizable compatible plasticizers (e) are effective in achieving reasonable exposure time and good printout images. The at least one plasticizer selected should be compatible with the binder as well as the other components of the composition. With acrylic binders, for example, useful plasticizers include: dibutyl phthalate, dioctyl phthalate, and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; low molecular weight polyesters; and chlorinated paraffins; etc. In general, water insoluble plasticizers are preferred for greater high humidity storage stability and environmental operating latitude, but are not required. Specific useful plasticizers include: triethylene glycol, triethylene glycol diacetate, triethylene glycol dipropionate, triethylene glycol dicaprylate, triethylene glycol dimethyl ether, triethylene glycol bis(2-ethyl-hexanoate), tetraethylene glycol diheptanoate, poly(ethylene glycol), poly(ethylene glycol) methyl ether, diethylene glycol dibenzoate, isopropylnaphthalene, diisopropylnaphthalene, poly(propylene glycol), glyceryl tributyrate, diethyl adipate, diethyl sebacate, dibutyl suberate, tributyl phosphate, tris (2-ethylhexyl) phosphate, t-butylphenyl diphenyl phosphate (Santicizer®; 154), triacetin, triisooctyl trimellitate, Brij® 30 [$C_{12}H_{25}(OCH_2CH_2)_{40}H$], and Brij® 35 [$C_{12}H_{25}(OCH_2CH_2)_{20}OH$], Brij® is a registered trademark of ICI Americas, Wilmington, Del.; tris(2-butoxyethyl) phosphate and phthalates such as dicyclohexyl phthalate, dioctyl phthalate, diphenyl phthalate, diundecyl phthalate, butyl benzyl phthalate (Santicizer® 160), 2-ethylhexyl benzyl phthalate (Santicizer® 261), alkyl benzyl phthalate (Santicizer® 278). Santicizer® is a registered trademark of Monsanto Co., St. Louis, Mo.. Many of the plasticizers can be expressed by the following general formulae:

$$R_1\overset{O}{\overset{\|}{C}}(OCH_2CH_2)_xO\overset{O}{\overset{\|}{C}}-R_2;$$

$$R_1O\overset{O}{\overset{\|}{C}}(CH_2)_y\overset{O}{\overset{\|}{C}}-OR_2; \text{ or}$$

$$R_3(OCH_2CHR_4)_zOH$$

wherein each of $R_1$ and $R_2$ is alkyl group of 1 to 10 carbon atoms; $R_3$ is H or an alkyl group having 8 to 16 carbon atoms, $R_4$ is H or CH3; x is 1 to 4; y is 2 to 10 and z is 1 to 20. Particularly preferred plasticizers are triethylene glycol dicaprylate, tetraethylene glycol diheptanoate, diethyl adipate, 2-ethylhexyl benzyl phthalate and tris-(2-ethylhexyl)phosphate. Additional plasticizers that are useful in the photosensitive compositions will be apparent to those skilled in the art, and may be employed in accordance with the invention. Preferred plasticizers are those which are moisture insensitive and those which are not extracted by nonpolar liquids such as Isopar®-L.

At least two of the above plasticizers with different viscosities may be used to improve environmental latitude. Preferred combinations of plasticizers include: Santicizer® 278 and Santicizer® 261, Santicizer® 154 and Santicizer® 261, Santicizer® 278 and Santicizer® 160, Santicizer® 261 and either glyceryl tribenzoate or acetylated polyester (Morflex® P-50A, Pfizer Co., NY, N.Y.).

The combination of binder and plasticizer is important for achieving the necessary minimum contrast potential, i.e., the difference in voltage between the exposed and unexposed areas at the time of development, to achieve the desired developed image density. The combination of binders and plasticizers to give matrices with different glass transition temperatures (Tg's) is selected so that some degree of charge mobility within the film matrix is achievable.

OPTIONAL INGREDIENTS

Additional useful components that can be present in the photosensitive layer include: co-initiators, visible sensitizers, thermal stabilizers or thermal inhibitors, brighteners, UV light absorbers, coating aids, electrical property modifiers, e.g., electron acceptors, electron donors, etc. Useful co-initiators include: benzophenones, alkylarylketones and mixtures thereof.

Visible sensitizers that may also be present in the photosensitive layer, for example, may be arylylidene aryl ketones such as are disclosed in Dueber, U.S. Pat. No. 4,162,162, the disclosure of which is incorporated herein by reference. The sensitizers absorb radiation in the broad spectral range of 300 to 700 nm. The maximum absorption (λmax.) is in the range of 350 to 550 nm, preferably 400 to 500 nm.

Useful thermal stabilizers or inhibitors include: hydroquinone, 1,4,4-trimethyl-diazobicyclo-(3.2.2)-non-2-ene-2,3-dioxide, 1-phenyl-3-pyrazolidinone, 4-(hydroxy-methyl)-4-methyl-1-phenyl-3-pyrazolidinone, p-methoxy-phenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982, the disclosure of which is incorporated herein by reference, are also useful. Preferably a thermal stabilizer or inhibitor is present in the photosensitive composition to increase storage stability of the photosensitive composition.

Useful UV absorbers and coating aids are known to those skilled in the art.

Useful electron donors and electron acceptors are disclosed in Blanchet-Fincher, U.S. Pat. No. 4,849,314, the disclosure of which is incorporated herein by reference. Examples of such compounds include: aromatic amines, e.g., triphenyl amine, methyl diphenyl amine, N-dimethyl aniline; aromatic phosphines, e.g., triphenyl phosphine; triphenyl arsine; triphenyl antimony; carbazole compounds, e.g., 9-ethylcarbazole, poly(9-vinylcarbazole); polycyclic aromatic compounds, e.g., naphthalene, benzophenone, trinitrofluorenone, p-biphenyl. Triphenylamine is a preferred electron donor, biphenyl is a preferred electron acceptor.

Other additives which may modify electrical properties and ultimate print quality include: N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis-(mercaptoacetate), 4-acetamidothiophenol, dodecanethiol, and betamercaptoethanol. Other compounds which can be used include: 1-phenyl-4H-tetrazole-5-thiol, 6-mercaptopurine monohydrate, bis-(5-mercapto-1,3,4-thiodiazol-2-yl), 2-mercapto-5-nitrobenzimidazole, and 2-mercapto-4-sulfo-6-chlorobenzoxazole, etc.

In general, the essential components of the photosensitive composition should be used in the following approximate proportions: (a) binders, 40 to 85 percent, preferably 50 to 75 percent; (b) hexaarylbibimidazole photooxidant, 1 to 20 percent, preferably 2 to 6 percent; (c) leuco dye, 0.5 to 40 percent, preferably 0.5 to 6 percent; (d) halogenated compound, 0.08 to 10 percent, preferably 0.25 to 5 percent; and (e) plasticizer 2 to 50 percent, preferably 10 to 40 percent. These are weight percentages based on total weight of the photosensitive composition. The preferred proportions may depend upon the particular compounds selected for each component. For example, the amount of component (b) may depend upon film speed requirement. Compositions with component (b) content above 10 percent by weight, for example, provide films of high sensitivity (high speed) and can be used with laser imaging in recording digitized information, as in digital color proofing. For analog applications, e.g., exposure through a separation or phototool, film speed requirement depends upon the mode of exposure.

The photosensitive electrostatic master is prepared by mixing the photosensitive ingredients in a solvent such as methylene chloride, or any other solvent that will dissolve all the ingredients of the photosensitive composition. Higher boiling co-solvents that aid in coating and drying are also useful, e.g., methanol, isopropanol, etc. The photosensitive solution may then be coated by means known to those skilled in the art on a conductive substrate, and the solvent evaporated. Dry coating weight should be about 40 to 250 $mg/dm^2$, preferably 80 to 150 $mg/dm^2$, The conductive support may be a metal plate, such as aluminum, copper, zinc, silver or the like, a conductive polymeric film, e.g., polyethylene terephthalate, etc., or a support such as paper, glass, synthetic resin, etc. which have been coated on one or both sides with a metal, conductive metal oxide, or conductive metal halide by vapor deposition or chemical deposition; a support which has been coated with a conductive polymer; or a support which has been coated with a polymeric binder containing a metal, conductive metal oxide, conductive metal halide, conductive polymer, carbon, or other conductive fillers, etc.

Positive images are prepared advantageously by a single imagewise exposure followed by charging and toning. The photosensitive layer is exposed to radiation of wavelength in the 200 to 550 nm range preferably about 310 to about 400 nm. Any convenient source of ultraviolet/visible light may be used to activate the light-sensitive composition and induce the formation of an image. In general, light sources that supply radiation in the region between about 200 nm and about 550 nm are useful in producing images. Among the light sources which can be employed are sun lamps, electronic flash guns, germicidal lamps, mercury-vapor arcs, fluorescent lamps with ultraviolet emitting phosphors, argon and xenon glow lamps, electronic flash units, photographic flood lamps, ultraviolet lamps providing specifically light of short wavelength (253.7 nm) and lamps providing light of long wavelength (450 nm). The light exposure time will vary from a fraction of a second to several minutes depending upon the intensity of the light, its distance from the photosensitive composition, the opacity of the phototool, the nature and amount of the photosensitive composition, and the intensity of color in the image desired. There may also be used coherent light beams, for example, electron beam, pulsed nitrogen lasers, argon ion lasers and ionized Neon II lasers, whose emissions fall within or overlap the ultraviolet absorption bands of component (b). Visible light emitting lasers such as argon ion, krypton ion, helium-neon, and frequency doubled YAG lasers may be used for visibly sensitized photosensitive layers.

Ultraviolet emitting cathode ray tubes widely useful in printout systems for writing on photosensitive materials are also useful for imaging the subject compositions. These in general involve a UV-emitting phosphor internal coating as the means for converting electrical energy to light energy and a fiber optic face plate as the means for directing the radiation to the photosensitive target. For purposes of this invention, the phosphors should emit strongly below 420 nm so as to substantially overlap the near UV-absorption characteristic of the photosensitive compositions of the invention. Representative phosphors include the P4B (emitting at 300–550 nm, peaking at 410 nm), P16 (330–460 nm, peaking at 380 nm) and P22B (390–510 nm, peaking at 450 nm) types. Electronic Industries Association, New York, N.Y. assigns P-numbers and provides characterizing information on the phosphors; phosphors with the same P-number have substantially identical characteristics.

Images may be formed in the photosensitive layer by a beam of light or by exposure to light of a selected area behind a positive separation, a stencil, or other relatively opaque pattern. The positive separation may be one in which the opacity results from aggregations or areas of different refractive index. Image formation may also be accomplished in a conventional diazo printing apparatus, or in a thermography device, provided the instrument emits some of its light in the ultraviolet range. A piece of onionskin or light-to-medium-weight bond paper which bears typewriting, for example, may serve as a master pattern from which copies can be made.

Where artificial radiation sources are used, the distance between the photosensitive layer and the radiation source may be varied according to the radiation sensitivity and the nature of the photosensitive composition. Customarily, mercury vapor arcs are used at a distance of 1.5 to 60 inches (3.8 to 152.4 cm) from the photosensitive layer. Radiation fluxes of 10–10,000 $\mu w/cm^2$ are generally suitable for use.

The length of time for which the photosensitive compositions are exposed to radiation may vary upward from fractions of a second. The exposure times will vary, in part, according to the nature and concentration of the stabilized leuco dye, halogenated compound, compatible plasticizer, photooxidant, and the type of radiation. Exposure can occur over a wide range of temperatures, as for example, from about 0° C. up to about 40° C. with selected compositions. Preferred exposure temperatures range from about 10° to about +35° C. There is an obvious economic advantage to operating the process at room temperature.

Imagewise exposure, for example in preparing electrostatic masters, is conveniently carried out by exposing a layer of the photosensitive composition to radiation through a process transparency; that is, an image-bearing transparency consisting solely of areas substantially opaque and substantially transparent to the radiation being used where the opaque areas are substantially of the same optical density; for example, a so-called line or halftone negative or positive. Process transparencies may be constructed of any suitable coated material, including cellulose acetate film and polyethylene terephthalate film. Charging and toning of the exposed master provides a positive working master suitable for use in color proofing applications, etc.

The preferred charging means is corona discharge. Other charging methods, e.g., discharge of a capacitor, can also be used.

Any electrostatic liquid toner or dry powder toner and any method of toner application can be used. Preferred liquid toners, consist essentially of a suspension of pigmented resin toner particles in a nonpolar liquid, the toner particles being charged with ionic or zwitterionic compounds. The nonpolar liquids normally used are the Isopar® branched chain aliphatic hydrocarbons (registered trademark of Exxon Corporation) which have a Kauri-butanol value of less than 30. These are narrow high purity cuts of isoparaffinic hydrocarbon fractions with the following boiling ranges Isopar®-G, 157°-176° C., Isopar®-H 176°-191° C., Isopar®-K 177 °-197° C., Isopar®-L 188°-206° C., Isopar®-M 207°-254° C., Isopar®-V 254°-329° C. Preferred resins having an average particle size of less than 10 μm, preferably less than 5 μm, are copolymers of ethylene (80 to 99.9%)/acrylic or methacrylic acid (20 to 0 %)/alkyl ester of acrylic or methacrylic acid where alkyl is 1 to 5 carbon atoms (0 to 20%), e.g., copolymers of ethylene (89%) and methacrylic acid (11%) having a melt index at 190° C. of 100. Useful nonpolar liquid soluble ionic or zwitterionic charge director compounds are lecithin and Basic Barium Petronate® oil-soluble petroleum sulfonate, Witco Corp., New York, N.Y. Optionally present in the nonpolar liquid is at least one adjuvant compound as described in Mitchell U.S. Pat. Nos. 4,631,244, 4,663,264, and 4,734,352, Taggi U.S. Pat. No. 4,670,370, Larson U.S. Pat. No. 4,702,985, Larson and Trout U.S. Pat. No. 4,681,831, El-Sayed and Taggi U.S. Pat. No. 4,702,984, and Trout U.S. Pat. No. 4,707,429. The disclosures of these United States patents are incorporated herein by reference.

Representative useful dry electrostatic toners include: Kodak Ektaprint®K, Hitachi HI Toner HMT-414, Canon NP-350 F toner, Toshiba T-50P toner, etc. The invention is not limited by these toners.

Useful developing techniques include the cascade, magnetic-brush and powder-craft methods using dry toners. Standard known liquid developer techniques can be used with the liquid electrostatic developers.

After toning or developing, the toned or developed image is transferred to a receptor surface, such as paper, etc. for the preparation of a proof. It is possible to transfer from the latter to another receptor to get a right reading image. Other receptors without being limited are polymeric film, or cloth. For making integrated circuit boards, the transfer surface can be an insulating board covered with a conductor, e.g., a fiber glass board covered with a copper layer, on which a resist is printed by this process. Transfer is accomplished by electrostatic or other means, e.g., by contact with an adhesive receptor surface. Electrostatic transfer can be accomplished in any known manner, e.g., by placing the transfer surface in contact with the toned image, applying to the surface a conductive rubber roll to assure maximum contact, and applying corona discharge to the backside of the transfer element immediately thereafter.

INDUSTRIAL APPLICABILITY

The photosensitive electrostatic master having improved environmental latitude, e.g., to humidity and temperature changes, is particularly useful in the graphic arts field, particularly in the area of color proofing wherein the proofs prepared duplicate the images achieved by printing. Because of the molecular structure of the dye images, very high resolution is feasible. A photosensitive electrostatic master having improved environmental latitude and capable of forming a print out image (POI) has additional advantages which include:

(1) the user can immediately determine that the master has been exposed;
(2) multiple burns or images can be made and positioned easily;
(3) visual corrections can be made more easily; this is very important in removal of cut-lines from positive photosensitive masters;
(4) unexposed areas can be annotated with a light-pen and the annotation will then become part of the information on the master; and
(5) the ability to generate POI's in different colors makes it possible to color-code masters, e.g., the master from a cyan separation may have a cyan-POI, the master from the magenta separation giving a magenta-POI, etc.; this can avoid errors due to mispositioning the master in a sequential printing system.

The photosensitive electrostatic master can also be used to transfer an etch resistant ink for the manufacture of printed circuit boards.

EXAMPLES

The following examples illustrate but do not limit the invention. The parts and percentages are by weight.

Glossary

Binders

B1 Polymethyl methacrylate n=1.25, where n is inherent viscosity Tg=110° C., where Tg is the glass transition temperature
B2 Ethyl methacrylate resin, n=1.50, Tg=70° C.
B3 Isobutyl methacrylate resin, n=0.63, Tg=55° C.
B4 Methyl methacrylate copolymer resin, n=0.40, Tg=40° C.
B5 Poly(styrene/methyl methacrylate) 70/30, Tg=95° C.
B6 Polycarbonate, Tg=150° C.
B7 Polysulfone, Tg=190° C.
B8 Cycolac® CTB acrylonitrile/butadiene/styrene, Tg=80°-84° C.

PLASTICIZERS

P1 2-Ethylhexyl benzyl phthalate (Santicizer®0 261, sold by Monsanto Co., St. Louis, Mo.)
P2 Glyceryl tribenzoate
P3 Acetylated polyester (Morflex® P-50A, Pfizer Co., NY, N.Y.)
P4 Butyl benzyl phthalate (Santicizer® 160)
P5 Tertiary-butylphenyl diphenyl phosphate (Santicizer® 154)
P6 Alkyl benzyl phthalate (Santicizer® 278) CAS No.16883-83-3

INITIATORS/PHOTOOXIDANTS

IN1 2,2'-Bis(o-chlorophenyl)-4,4',5,5'-tetraphenylbiimidazole
IN2 2,2',4,4'-Tetrakis(o-chlorophenyl)-5,5'-bis(m,p-dimethoxyphenyl) biimidazole

HALOGEN COMPOUNDS

H1 1,2-Dibromotetrachloroethane
H2 Dichloroacetamide

LEUCO DYES

LD1 Tris-(4-diethylamino-o-tolyl)methane
LD2 Bis-(4-diethylamino-o-tolyl)-phenylmethane none (phenidone)

ADDITIVES

A1 1-Phenyl-3-pyrazolidinone (phenidone)
A2 4,4'-Bis(diethylamino)benzophenone
A3 Pluronic® 31R, ethylene oxide/propylene oxide block copolymer surfactant sold by BASF Corp., Parsippany, N.J.
A4 Triphenylamine
A5 2-Mercaptobenzoxazole Except as indicated otherwise, the following procedures were used in all examples.

A solution containing about 80 parts methylene chloride and 20 parts of solids was coated onto a 0.004 inch (0.0102 cm) aluminized polyethylene terephthalate support. After the film had been dried at 60°-85° C. to remove the methylene chloride, a 0.00075 inch (0.0019 cm) polypropylene cover sheet was laminated to the dried layer. The coating weights varied from 80 to 15 150 mg/dm². The film was then wound on rolls until exposure and development occurred.

The formulations were tested for electrical properties as a function of ambient conditions. The environmental stability was evaluated by measuring the shift in transit times (aT) of each material with temperature (T) and relative humidity (RH), where the transit time $\tau$ is the time interval required by the charge carriers to travel across the sample and reach the ground plane of the material.

It has been found that by plotting the voltage decay or discharge curves of the electrostatically charged photosensitive master at different environmental conditions noted below the curves are related to each other. If both voltage and time are plotted as log (t) (x axis) and log (V) (y axis) then the discharge curves at differing environmental conditions can be superimposed by horizontal shifts along the log (time) axis. The time dependence of the voltage is expressed as:

$$V(t)=f(t/\tau)$$

where $\tau$ is the transit time for any given environmental condition. $\tau$ is dependent upon the environmental conditions, i.e., temperature and humidity, but the function $f(t/\tau)$ is invariant. As a result $\tau$ defines the changes in the discharge characteristics within the specified environmental conditions. The shift factor $a_T=\tau_1/\tau_2$ wherein $\tau_1$ and $\tau_2$ are the longer and shorter discharge times for two differing environmental conditions. $a_T$ provides a direct and straight forward way of comparing the relative humidity and temperature response of the different formulations. A smaller number for $a_T$ indicates lower environmental sensitivity. $a_T$ is 15 or less, preferably 10 or less.

The formulations were tested for the change in discharge rate (i.e., shift in transit time ($a_T$)) at the specified ambient conditions. The environmental specifications were set to be 30% ≦ relative humidity (RH)≦60% and 65° F. (18.3° C.)≦temperature (T)≦80° F. (26.7° C.). The electrostatic setup was placed in a small Tinney Benchmark environmental chamber which permitted accurate control of the environment in the T and RH range of interest (Tenney Engineering, Inc., South Brunswick, N.J.).

Surface voltage measurements were carried out as follows: 1 inch by 0.5 inch (2.54 cm by 1.27 cm) samples were mounted on a flat aluminum plate that was positioned on a friction free translational stage connected to a solenoid. The samples were moved from position A to B, about 1 inch (2.54 cm) apart, by activating the solenoid. In position A, they were placed directly under a scorotron for charging. The charging conditions were: 100–500 V grid voltage (Vg), 100–1000 microamps corona current (4.35 to 5.11 kV) and 2 seconds charging time. After charging was complete, the solenoid was energized and the samples moved to B, away from the scorotron and directly under Isoprobe electrostatic multimeters, Model #174, manufactured by Monroe Electronics, Lyndonville, N.Y. The outputs from the multimeters were fed into a computer (Model #9836, manufactured by Hewlett Packard, Palo Alto, Calif.) through a data acquisition box (Model #3852A, manufactured by Hewlett Packard, Palo Alto, Calif.) where the voltage versus time was recorded for each sample. Since movement of the samples took about 1 second, the "zero time" measurement was made within about 1 second after charging.

In order to test the image quality of each photosensitive composition, the photosensitive layer was exposed, charged, and toned with magenta toner, and the image transferred to paper as described below. In all cases "magenta toner" refers to the standard magenta toner used to form a four color proof described below. The evaluation of image quality was based on dot range and dot gain on paper. The standard paper is 60 lbs Solitaire® paper, offset enamel text, Plainwell Paper Co., Plainwell, Mich. However, the variety of papers tested included: 60 lbs Plainwell offset enamel text, 70 lbs Plainwell offset enamel text, 150 lbs white regal Tufwite® Wet Strength Tag, 60 lbs white LOE Gloss Cover, 70 lbs white Flokote® Text, 60 lbs white all purpose lith, 110 lbs white Scott index, 70 lbs white Nekoosa Vellum Offset and 80 lbs white Sov® text. Results indicated that, although the process can be used with any paper, the trapping of ink varies with the fibrillar nature of the paper in use.

Dot gain or dot growth versus dot size is a standard measure of how tolerances between a proof and a press proof are determined. The dot gains were measured using designed patterns called Brunner targets which are available from System Brunner USA, Inc., Rye, N.Y. Typically desired dot gains for graphic arts applications are in the range of 15 to 22% at midtone. The dot range was easily measured using UGRA targets, Graphic Arts Technical Foundation, Pittsburgh, PA, that include 0.5% highlight dots to 99.5% shadow dots in a 50 lines/inch screen and that includes 4 to 70 μm highlight and shadow microlines. Typically desired dot ranges for graphic arts applications are in the range of to 98%.

The photosensitive electrostatic master was first exposed through a separation positive using a Douthitt Option X Exposure Unit (Douthitt Corp., Detroit, Mich.), equipped with a model TU 64 Violux® 002 lamp assembly (Exposure Systems Corp., Bridgeport, Conn.) and model No. 5027 photopolymer type lamp. Exposure times varied from 1–100 seconds depending on the formulation. The exposed master was then mounted on a drum surface. SWOP (Specification Web Offset Publications) density in the solid regions was obtained by charging the unexposed regions of the photosensitive layer of the electrostatic master to 100 to 500 V. The charged latent image was then developed with a liquid electrostatic developer, or toner, using a two roller toning station and the developer layer properly metered. The developing and metering stations were placed at the 5 and 6 o'clock positions, respectively, on the drum. The toner image was corona transferred onto paper using 10–150 microamps transfer corona and 4.35 to 4.88 kV, and −2.5 to −8.0 kV tackdown roll voltage at a speed of 2.2 inches/second (5.59 cm/second) and fused in an oven for 15 seconds at 100° C.

The dot gain curves were measured using a programmable MacBeth densitometer, Model #RD 918, (McBeth Process Measurements, Newburgh, N.Y.) interfaced to a Hewlett Packard Computer, Model #9836. The dot gain curve was calculated by using a simple algorithm that included the optical density of the solid patch, the optical density of the paper (gloss) and the optical density of each percent dot area in the Brunner target.

A four color proof is obtained by following the steps described below. First, complementary registration marks are cut into the photosensitive layers of the electrostatic masters prior to exposure. Masters for each of the four color separations are prepared by exposing four photosensitive elements having coversheets to one of the four color separation positives corresponding to cyan, yellow, magenta and black colors. The cover sheets are removed, and each master is mounted on the corresponding color module drum, in a position assuring image registration of the four images as they are sequentially transferred from each master to the receiving paper. Leading edge clamps are used to ground the photosensitive master's aluminized backplane to the drum. The masters are stretched by spring loading the trailing edge assuring that each lays flat against its drum.

Each module comprises a charging scorotron at 3 o'clock position, a developing station at 5 o'clock, a metering station at 6 o'clock and a cleaning station at 9 o'clock positions, respectively. The charging, developing, and metering procedure is similar to that described above and prior to the examples. The transfer station consists of a tackdown roll, a transfer corona, paper loading, and a positioning device that fixes the relative position of paper and master in all four transfer operations.

In the preparation of the four-color proof the four developers, or toners, have the following compositions:

| INGREDIENTS | AMOUNT (g) |
|---|---|
| BLACK | |
| Copolymer of ethylene (89%) and methacrylic acid (11%), melt index at 190° C. is 100, Acid No. is 66 | 2,193.04 |
| Sterling NF carbon black | 527.44 |
| Heucophthal Blue, G XBT-583D Heubach, Inc., Newark, NJ | 27.76 |
| Basic Barium Petronate ®, Witco Corp., New York, NY | 97.16 |
| Aluminum tristearate, Witco 132 Witco Corp., New York, NY | 27.76 |
| Isopar ®-L, non-polar liquid having a Kauri-butanol value of 27, Exxon Corporation | 188,670.0 |
| CYAN | |
| Copolymer of ethylene (89%) and methacrylic acid (11%), melt index at 190° C. is 100, Acid No. is 66 | 3,444.5 |
| Ciba-Geigy Monarch Blue X3627 | 616.75 |
| Dalamar ® Yellow YT-858D Heubach, Inc., Newark, NJ | 6.225 |
| Aluminum tristearate, as described in black developer | 83.0 |
| Basic Barium Petronate ® (Witco Corp.) | 311.25 |
| Isopar ®-L as described in black developer | 292,987.0 |

-continued

| INGREDIENTS | AMOUNT (g) |
|---|---|
| MAGENTA | |
| Copolymer of ethylene (89%) and methacrylic acid (11%), melt index at 190° C. is 100, Acid No. is 66 | 4,380.51 |
| Mobay RV-6700, Mobay Chemical Corp., Haledon, NJ | 750.08 |
| Mobay RV-6713, Mobay Chemical Corp. Haledon, NJ | 750.08 |
| Aluminum tristearate, as described in black developer | 120.014 |
| Triisopropanol amine | 75.008 |
| Basic Barium Petronate ® (Witco Corp.) | 720.08 |
| Isopar ®-L as described in black developer | 378,876.0 |
| YELLOW | |
| Copolymer of ethylene (89%) and methacrylic acid (11%), melt index at 190° C. is 100, Acid No. is 66 | 1,824.75 |
| Yellow 14 polyethylene flush, Sun Chemical Co., Cincinnati, OH | 508.32 |
| Aluminum tristearate, as described in black developer | 46.88 |
| Basic Barium Petronate ® (Witco Corp.) | 59.5 |
| Isopar ®-L as described in black developer | 160,191.0 |

First, the cyan master is charged, developed and metered. The transfer station is positioned and the toned cyan image transferred onto the paper. After the cyan transfer is completed, the magenta master is corona charged, developed and metered, and the magenta image transferred, in registry, on top of the cyan image. Afterwards, the yellow master is corona charged, developed, and metered, and the yellow image is transferred on top of the two previous images. Finally the black master is corona charged, developed, metered, and the toned black image transferred, in registry, on top of the three previously transferred images. After the procedure is completed, the paper is carefully removed from the transfer station and the image fused for 15 seconds at about 100° C.

The parameters used for preparation of the proof are: drum speed, 2.2 inches/second (5.588 cm/second); grid scorotron voltage, 100 to 400 V; scorotron current 200 to 1000 microamps (5.11 to 6.04 kV); metering roll voltage, 20 to 200 V; tackdown roll voltage, −2.5 to −5.0 kV; transfer corona current, 10 to 150 microamps (4.35 to 4.88 kV); metering roll speed, 4 to 8 inches/-second (10.16 to 20.32 cm/second); metering roll gap, 0.002 to 0.005 inch (0.0051 to 0.0127 cm); developer conductivity 12 to 30 picomhos/cm; developer concentration, 1 to 2.0% solids.

EXAMPLES 1 to 4

Solutions of photosensitive compositions were prepared containing 80 parts of methylene chloride and parts of solids. The solids comprised binder or combinations of binders, plasticizer or combinations of plasticizers, initiator, halogen compound, leuco dye and additives. The solutions were coated on 0.004 inch (0.0102 cm) aluminized polyethylene terephthalate support and laminated with a 0.00075 inch (0.001905 cm) polypropylene cover sheet. The coating weights varied from 80 to 150 mg/dm$^2$ or an approximate thickness of 7 to 12 μm.

The photosensitive layer for each element had the compositions shown in Table 1 below wherein the amounts are in parts by weight The shifts in transit time $a_T$ from LL (18.3° C./30%RH) to HH (26.7° C./60%RH) environmental conditions are summarized in Table 2 for each element for both the unexposed and the exposed samples. A smaller number indicates lower environmental sensitivity.

TABLE 1

| SAMPLE | IN1 | H1 | LD1 | A2 | P1 | B1 | B2 | B5 |
|---|---|---|---|---|---|---|---|---|
| CONTROL 1 | 4 | 0.5 | 2 | 0.6 | 31 | 61.9 | | |
| CONTROL 2 | 4 | 0.5 | 2 | 0.6 | 30 | | | 62.9 |
| CONTROL 3 | 4 | 0.5 | 2 | 0.6 | 33 | | 66.9 | |
| EXAMPLE 1 | 4 | 0.5 | 2 | 0.6 | 29 | 25.0 | 38.9 | |
| EXAMPLE 2 | 4 | 0.5 | 2 | 0.6 | 28 | 42.9 | 22.0 | |
| EXAMPLE 3 | 4 | 0.5 | 2 | 0.6 | 28 | | 18.0 | 46.9 |
| EXAMPLE 4 | 4 | 0.5 | 2 | 0.6 | 27 | | 33.0 | 32.9 |

TABLE 2

| SAMPLE | $a_T$ (UNEXP.) | $a_T$ (EXPOSED) |
|---|---|---|
| CONTROL 1 | 12 | 12 |
| CONTROL 2 | 13 | 11 |
| CONTROL 3 | 8 | 11 |
| EXAMPLE 1 | 4 | 4 |
| EXAMPLE 2 | 7 | 8 |
| EXAMPLE 3 | 6 | 5 |
| EXAMPLE 4 | 3.4 | 5 |

Table 2 illustrates improved (less) T/RH sensitivity of Examples 1 to 4 (mixed binders) versus the Controls 1 to 3 (single binder).

EXAMPLES 5 and 6

Four photosensitive elements were prepared and tested as described in Example 1 with the following exceptions: the photosensitive layer for each element had the composition shown in Table 3 below. Results of shifts in transit time from LL to HH are shown in Table 4 below.

TABLE 3

| SAMPLE | IN1 | HI | LD1 | A2 | P1 | B6 | B8 | B2 | B4 |
|---|---|---|---|---|---|---|---|---|---|
| CONT. 4 | 4 | 0.5 | 2 | 0.6 | 33 | 59.9 | | | |
| CONT. 5 | 4 | 0.5 | 2 | 0.6 | 28 | | 64.9 | | |
| EX. 5 | 4 | 0.5 | 2 | 0.6 | 30 | 35.0 | | 27.9 | |
| EX. 6 | 4 | 0.5 | 2 | 0.6 | 23 | | 41.9 | | 28 |

TABLE 4

| SAMPLE | $a_T$ (UNEXP.) | $a_T$ (EXPOSED) |
|---|---|---|
| CONTROL 4 | 10 | 11 |
| CONTROL 5 | 30 | 8 |
| EXAMPLE 5 | 6 | 8 |
| EXAMPLE 6 | 8 | 7 |

This table further illustrates the advantage of using mixed binders (Examples 5 and 6) over the single binder Controls 4 and 5.

EXAMPLES 7 TO 9

Three photosensitive elements were prepared and evaluated as described in Example 1 with the following exceptions: the photosensitive layer for each element had the composition shown in Table 5 below. Results of shifts in transit time from LL to HH are shown in Table 6 below.

TABLE 5

| SAMPLE | IN1 | H1 | LD1 | A2 | P1 | B5 | B7 | B2 | B3 | B4 |
|---|---|---|---|---|---|---|---|---|---|---|
| EX. 7 | 4 | 0.5 | 2 | 0.6 | 27 | 47.9 | | | 18.0 | |

TABLE 5-continued

| SAMPLE | IN1 | H1 | LD1 | A2 | P1 | B5 | B7 | B2 | B3 | B4 |
|---|---|---|---|---|---|---|---|---|---|---|
| EX. 8 | 4 | 0.5 | 2 | 0.6 | 28 | | 25.9 | 39.0 | | |
| EX. 9 | 4 | 0.5 | 2 | 0.6 | 26 | 48.9 | | | | 18 |

TABLE 6

| SAMPLE | $a_T$(UNEXP.) | $a_T$(EXPOSED) |
|---|---|---|
| EXAMPLE 7 | 4 | 6 |
| EXAMPLE 8 | 5.5 | 7 |
| EXAMPLE 9 | 4 | 8 |

All $a_T$'s are improvements over single binder Controls 1 to 5.

EXAMPLES 10 TO 13

Four photosensitive elements comprising various combinations of photooxidants, halogen compounds and leuco dyes were prepared and tested as described in Example 1 with the following exceptions: the photosensitive layer for each element had the composition shown in Table 7 below and the results of shifts in transit time are shown in Table 8 below.

TABLE 7

| SAMPLE | IN1 | IN2 | H1 | H2 | LD1 | LD2 | A1 | A2 | P1 | B2 | B5 |
|---|---|---|---|---|---|---|---|---|---|---|---|
| EX. 10 | | 4 | 0.5 | | | 2 | 0.02 | 0.6 | 27.3 | 48.2 | 17.4 |
| EX. 11 | 4 | | 0.5 | | 2 | | 0.02 | 0.6 | 27.3 | 48.2 | 17.4 |
| EX. 12 | | 4 | 0.5 | | 2 | | 0.02 | 0.6 | 27.3 | 48.2 | 17.4 |
| EX. 13 | 3.5 | | | 1.0 | 2 | | 0.02 | 0.6 | 27.3 | 48.2 | 17.4 |

TABLE 8

| SAMPLE | $a_T$(UNEXP.) | $a_T$(EXPOSED) |
|---|---|---|
| EXAMPLE 10 | 7 | 6 |
| EXAMPLE 11 | 8 | 6 |
| EXAMPLE 12 | 7 | 6 |
| EXAMPLE 13 | 10 | 3.5 |

All $a_T$'s are lower than those of the single binder Controls 1 to 5.

EXAMPLE 14 TO 16

Three photosensitive elements comprising various binders and plasticizer combinations were prepared and tested as described in Example 1 with the following exceptions: the photosensitive layer for each element had the composition shown in Table 9 below and the results of shifts in transit time from LL to HH are shown in Table 10 below.

TABLE 9

| SAMPLE | IN1 | H1 | LD1 | A1 | A2 | P1 | P2 | P3 | B1 | B2 | B5 |
|---|---|---|---|---|---|---|---|---|---|---|---|
| EX. 14 | 4 | 0.5 | 2 | 0.02 | 0.6 | 29.9 | | | 48 | 15.0 | |
| EX. 15 | 4 | 0.5 | 2 | 0.02 | 0.6 | 26.3 | 3.4 | | | 16.6 | 46.6 |
| EX. 16 | 4 | 0.5 | 2 | 0.02 | 0.6 | 17.3 | | 10 | | 17.4 | 48.2 |

TABLE 10

| SAMPLE | $a_T$(UNEXP.) | $a_T$(EXPOSED) |
|---|---|---|
| EXAMPLE 14 | 7 | 7.5 |
| EXAMPLE 15 | 5 | 5 |
| EXAMPLE 16 | 6 | 8 |

All $a_T$'s are improvements over the single binder Controls 1 to 5.

EXAMPLES 17 TO 21

Five photosensitive elements comprising various combinations of binders, plasticizers and additives were prepared and evaluated as described in Example 1. The compositions are shown in Table 11 below and the results of shifts in transit time from LL to HH are summarized in Table 12 below.

TABLE 11

| SAMPLE | IN1 | H1 | LD1 | LD2 | A3 | A4 | A5 | P1 | P4 | P5 | P6 | B1 | B2 | B5 |
|---|---|---|---|---|---|---|---|---|---|---|---|---|---|---|
| EX. 17 | 4 | 0.5 | 4 | 3 | | 5 | 0.1 | 12.5 | | 15 | | | 20.9 | 45 |
| EX. 18 | 4 | 0.5 | 4 | 3 | | 5 | 0.1 | 17.5 | | 15 | | | 20.9 | 40 |
| EX. 19 | 4 | 0.5 | 4 | | 1 | 5 | 0.1 | 12.0 | | 14.5 | | 48 | 20.9 | |
| EX. 20 | 4 | 0.5 | 4 | | | 5 | 0.1 | 9.0 | 7.5 | 7 | 7 | | 20.9 | 45 |
| EX. 21 | 4 | 0.5 | 4 | | | 5 | 0.1 | 7.9 | 7.5 | 7 | 7 | 43.1 | 20.9 | |

TABLE 12

| SAMPLE | $a_T$(UNEXP.) | $a_T$(EXPOSED) |
|---|---|---|
| EXAMPLE 17 | 9 | 9 |
| EXAMPLE 18 | 8 | 7 |
| EXAMPLE 19 | 9 | 9 |
| EXAMPLE 20 | 10 | 9 |
| EXAMPLE 21 | 10 | 8 |

EXAMPLE 22

This example illustrates the use of the photosensitive electrostatic master in the preparation of a four color proof.

The following composition was prepared from the indicated ingredients in parts:

| B2 | B5 | P1 | IN1 | LD1 | HI | A1 | A2 | A5 |
|---|---|---|---|---|---|---|---|---|
| 17.46 | 48.36 | 27.01 | 4.0 | 1.9 | 0.5 | 0.02 | 0.6 | 0.1 |

After the solution was stirred for 24 hrs to properly dissolve all the components, it was coated onto 0.004 inch (0.0102 cm) aluminized polyethylene terephthalate film base at 100 ft/min. coating speed. Coating weight was 118 mg/dm$^2$ A 0.00075 inch (0.001905 cm) polypropylene cover sheet was laminated over the photosensitive layer immediately after drying. The material thus formed was cut into four pieces about 30 inch by 40 inch (76.2 cm by 101.6 cm) in size for preparation of a four color proof.

A four color proof was obtained by following the general procedure for making a color proof outlined previously using photosensitive electrostatic masters exposed through the respective cyan, magenta, yellow and black color separation positives. Good image quality and dot gains were observed.

We claim:

1. An improved photosensitive electrostatic master having reduced temperature and humidity sensitivity comprising (1) an electrically conductive substrate, and (2) a layer of photosensitive composition consisting essentially of (a) at least two organic polymeric binders, at least one binder having a Tg greater than 80° C. and at least one binder having a Tg of 70° C. or less such that the shift in transit time ($a_T$) of the photosensitive layer in the range 30% ≦ relative humidity ≦60% and 65° F. (18.3° C.)≦temperature <80° F. (26.7° C.) is 10 or less;

(b) a hexaarylbiimidazole photooxidant, (c) a leuco dye that is oxidizable to an ionic species by the photooxidant, (d) a nonionic halogenated compound, and (e) at least one compatible plasticizer.

2. A photosensitive electrostatic master according to claim 1 wherein the binder having a Tg greater than 80° C. is selected from the group consisting of acrylate and methacrylate polymers and copolymers, vinyl polymers and copolymers, polyvinyl acetals, polycarbonates, polysulfones, polyetherimides, and polyphenylene oxides.

3. A photosensitive electrostatic master according to claim 2 wherein the binder is a methacrylate polymer or copolymer.

4. A photosensitive electrostatic master according to claim 3 wherein the binder is poly(styrene/methyl methacrylate).

5. A photosensitive electrostatic master according to claim 3 wherein the binder is poly(methyl methacrylate).

6. A photosensitive electrostatic master according to claim 2 wherein the polymeric binder is polycarbonate.

7. A photosensitive electrostatic master according to claim 2 wherein the binder is polysulfone.

8. A photosensitive electrostatic master according to claim 1 wherein the binder with a Tg of 70° C. or less is selected from the group consisting of acrylate and methacrylate polymers and copolymers, vinyl polymers and copolymers, polyvinyl acetals, polyesters, polyurethanes, butadiene copolymers, cellulose esters and cellulose ethers.

9. A photosensitive electrostatic master according to claim 8 wherein the binder is a methacrylate polymer or copolymer.

10. A photosensitive electrostatic master according to claim 9 wherein the binder is poly(ethyl methacrylate).

11. A photosensitive electrostatic master according to claim 9 wherein the binder is poly(isobutyl methacrylate).

12. A photosensitive electrostatic master according to claim 9 wherein the binder is poly(cyclohexyl methacrylate).

13. A photosensitive electrostatic master according to claim 8 wherein the binder is poly(tertiary-butyl acrylate).

14. A photosensitive electrostatic master according to claim 1 wherein the photooxidant is 2,2',4,4',5,5'-hexaarylbiimidazole.

15. A photosensitive electrostatic master according to claim 14 wherein the photooxidant is 2,2',4,4'-tetrakis(o-chlorophenyl)-5,5'-bis(m,p-dimethoxyphenyl)-biimidazole.

16. A photosensitive electrostatic master according to claim 14 wherein the photooxidant is 2,2'-bis(o-chlorophenyl)-4,4',5,5'-tetraphenylbiimidazole.

17. A photosensitive electrostatic master according to claim 1 wherein the leuco dye is stabilized.

18. A photosensitive electrostatic master according to claim 17 wherein the stabilized leuco dye is tris-(4-diethylamino-o-tolyl)methane.

19. A photosensitive electrostatic master according to claim 17 wherein the stabilized leuco dye is 9-diethylamino-12-(2-methoxycarbonyl-phenyl)-benz(a) xanthene.

20. A photosensitive electrostatic master according to claim 1 wherein the halogenated compound is a halogenated hydrocarbon selected from the group consisting of aromatic, aliphatic, alicyclic and combinations thereof.

21. A photosensitive electrostatic master according to claim 20 wherein the halogenated hydrocarbon is substituted by a member selected from the group consisting of oxygen, amine, amide, hydroxyl, nitrile and phosphate.

22. A photosensitive electrostatic master according to claim 20 wherein the halogenated hydrocarbon is 1,2-dibromotetrachloroethane.

23. A photosensitive electrostatic master according to claim 20 wherein the halogenated hydrocarbon is trichloroacetamide.

24. A photosensitive electrostatic master according to claim 1 wherein the compatible plasticizer is selected from the group consisting of dioctyl phthalate, triacetin, t-butylphenyl diphenyl phosphate, diethyleneglycol dibenzoate and 2-ethylhexyl benzyl phthalate and combinations thereof.

25. A photosensitive electrostatic master according to claim 24 wherein the plasticizer is 2-ethylhexyl benzyl phthalate.

26. A photosensitive electrostatic master according to claim 1 wherein at least two plasticizers are present.

27. A photosensitive electrostatic master according to claim 26 wherein the plasticizers are 2-ethylhexyl benzyl phthalate and glyceryl tribenzoate.

28. A photosensitive electrostatic master according to claim 1 wherein the conductive substrate is aluminized polyethylene terephthalate.

29. A photosensitive electrostatic master according to claim 1 wherein binders (a) are present in 40 to 85 percent, photooxidant (b) is present in 1 to 20 percent, leuco dye (c) is present in 0.5 to 40 percent, halogenated compound (d) is present in 0.25 to 10 percent, and plasticizer (e) is present in 2 to 50 percent, the weight percentages based on the total weight of the photosensitive composition.

30. A photosensitive electrostatic master according to claim 1 wherein a visible sensitizer is present.

31. A photosensitive electrostatic master according to claim 30 wherein the visible sensitizer is an arylylidene aryl ketone.

32. A photosensitive electrostatic master according to claim 1 wherein a thermal stabilizer is present.

33. A photosensitive electrostatic master according to claim 32 wherein the thermal stabilizer is 1-phenyl-3-pyrazolidinone.

34. A photosensitive electrostatic master according to claim 1 wherein the layer of photosensitive composition consists essentially of (a) poly(methyl methacrylate) and poly(ethyl methacrylate)

(b) 2,2'-bis(o-chlorophenyl)-4,4',5,5'-tetraphenylbiimidazole (c) tris-(4-diethylamino-o-tolyl)methane, (d) 1,2-dibromotetrachloroethane, and (e) 2-ethylhexyl benzyl phthalate 35. A photosensitive electrostatic master according to claim 1 wherein over the photosensitive layer is a protective coversheet.

* * * * *